(12) United States Patent
Bunce et al.

(10) Patent No.: US 7,088,638 B1
(45) Date of Patent: Aug. 8, 2006

(54) GLOBAL AND LOCAL READ CONTROL SYNCHRONIZATION METHOD AND SYSTEM FOR A MEMORY ARRAY CONFIGURED WITH MULTIPLE MEMORY SUBARRAYS

(75) Inventors: Paul A. Bunce, Poughkeepsie, NY (US); John D. Davis, Wallkill, NY (US); James W. Dawson, Poughkeepsie, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 11/054,176

(22) Filed: Feb. 9, 2005

(51) Int. Cl.
*G11C 8/00* (2006.01)

(52) U.S. Cl. ............ 365/233; 365/230.01; 365/230.03; 365/230.06

(58) Field of Classification Search .................... None
See application file for complete search history.

(56) References Cited

U.S. PATENT DOCUMENTS

| 5,663,923 | A | * | 9/1997 | Baltar et al. ........... 365/230.03 |
| 5,774,409 | A | * | 6/1998 | Yamazaki et al. ...... 365/230.03 |
| 5,831,924 | A | * | 11/1998 | Nitta et al. ............. 365/230.03 |
| 5,966,315 | A | | 10/1999 | Muller et al. ................. 365/51 |
| 5,986,914 | A | | 11/1999 | McClure ..................... 365/63 |
| 5,991,223 | A | * | 11/1999 | Kozaru et al. .......... 365/230.03 |
| 6,064,623 | A | * | 5/2000 | Ha ........................ 365/230.06 |
| 6,809,947 | B1 | | 10/2004 | Alexanian ..................... 365/63 |
| 2005/0007859 | A1 | * | 1/2005 | Chung et al. .......... 365/230.03 |

* cited by examiner

*Primary Examiner*—Son Mai
(74) *Attorney, Agent, or Firm*—Lynn L. Augspurger, Esq.; Kevin P. Radigan, Esq.; Heslin Rothenberg Farley & Mesiti, P.C.

(57) ABSTRACT

A global and local read control synchronization method and system are provided for a memory array configured with multiple memory subarrays. Address signals are decoded to activate based thereon subarray select signals and a cumulative subarray select signal. The cumulative subarray select signal goes active whenever a subarray select signal goes active, and therefore, each pulse of the cumulative subarray select signal is synchronous with one pulse of the subarray select signals. Local read control signals for the multiple memory subarrays are obtained employing the subarray select signals, and at least one global read control signal for the memory array is obtained employing the cumulative subarray select signal. In one example, the memory array has a hierarchical bitline architecture.

26 Claims, 6 Drawing Sheets fig. 1 fig. 2 fig. 3

GLOBAL AND LOCAL READ CONTROL SYNCHRONIZATION METHOD AND SYSTEM FOR A MEMORY ARRAY CONFIGURED WITH MULTIPLE MEMORY SUBARRAYS

CROSS-REFERENCE TO RELATED APPLICATION

This application contains subject matter which is related to the subject matter of the following application, which is assigned to the same assignee as this application and filed on the same day as this application. The below-listed application is hereby incorporated herein by reference in its entirety:

"Write Control Circuitry and Method for a Memory Array Configured with Multiple Memory Subarrays", by Davis et al., Ser. No. 10/054,059.

TECHNICAL FIELD OF THE INVENTION

This invention relates in general to the operation of memory arrays, and more particularly, to a method and system for synchronizing global read control and local read control signals for a memory array configured with multiple memory subarrays.

BACKGROUND OF THE INVENTION

Memory arrays with hierarchical or "segmented" bitline architectures have been developed in recent years in order to increase the integration density of memory chips. This architecture allows for a reduced number of space-consuming sense amplifiers for a given number of memory cells, thus reducing chip size or increasing memory capacity for a given sized chip.

In a hierarchical bitline architecture, each column within a memory cell array includes a number of equal length local bitlines (LBLs), directly connected to the memory cells, and to global bitlines (GBLs), for example, composed of a high conductivity metal disposed at a higher fabrication layer than the local bitlines. By way of example, each local bitline may connect to several hundred memory cells, while each global bitline is connected directly to a sense amplifier and is selectively coupled to a number of local bitlines in a common column by a number of switches. To access (e.g., read) a memory cell connected to a particular local bitline, the switch connecting that local bitline to the global bitline is closed, while the other switches in the column are open.

In order for a hierarchical bitline memory array, such as a static random access memory (SRAM) array, to maintain functionality and high speed performance over a range of power supplies, temperature and process variations, global read control signals that maintain timing relationships (tracking) to local read control signals of the respective memory subarrays are desirable. Prior attempts at synchronization have employed programmable delays based on a grid clock or system clock to generate the global read control signals. With such implementations, however, there is no inherent tracking between the global and local control signals.

Thus, provided herein are novel techniques for synchronizing global and local read control signals for a memory array configured with multiple memory subarrays, such as a hierarchical bitline SRAM architecture.

SUMMARY OF THE INVENTION

The shortcomings of the prior art are overcome and additional advantages are provided through the provision of a global and local read control synchronization method for a memory array configured with multiple memory subarrays. The method includes: decoding address signals to activate based thereon subarray select signals and a cumulative subarray select signal, the cumulative subarray select signal going active whenever a subarray select signal goes active; and wherein local read control signals for the multiple memory subarrays are obtained employing the subarray select signals, and at least one global read control signal for the memory array is obtained employing the cumulative subarray select signal.

In a further aspect, a method is provided which includes providing a memory array configured with multiple memory subarrays, each subarray being accessed via a respective subarray select signal; and synchronizing global read control signals for the memory array with local read control signals for the memory subarrays, the synchronizing including decoding subarray address signals to activate based thereon the subarray select signals and a cumulative subarray select signal, the cumulative subarray select signal going active whenever a subarray select signal goes active, wherein the local read control signals for the multiple memory subarrays are obtained employing the subarray select signals, and at least one global read control signal for the memory array is obtained employing the cumulative subarray select signal.

Systems corresponding to the above summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As noted briefly above, in order for memory arrays configured with a hierarchical bitline architecture to maintain functionality and high speed performance over a range of power supplies, temperature and process variations, global read control signals that maintain timing relationships (tracking) to the local read control signals are desired. In a prior approach, programmable delays based off of a grid clock were employed to generate the global read control signals. This programmable delay approach, however, offers little tracking between global and local control signals. By programming the various delays, a memory array can function, but the performance may be unacceptable.

Figure 1:
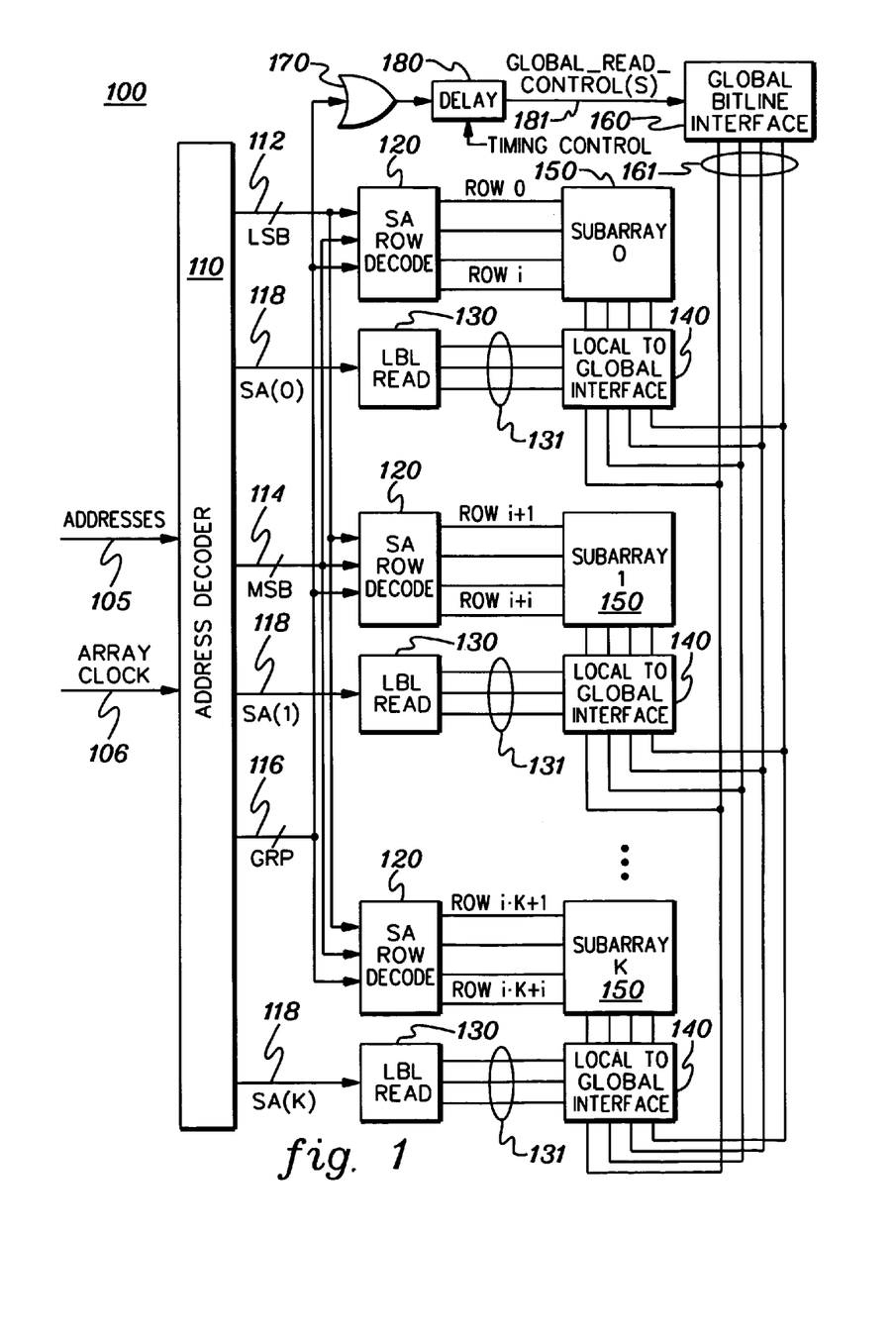
FIG. 1 is a diagram of one embodiment of a memory array having multiple memory subarrays and employing a group bit ORing circuit to syhncronize global read control signals with local read control signals of the respective memory subarrays, in accordance with an aspect of the present invention.

FIG. 1 depicts an alternative embodiment to the above-outlined approach. One example of this embodiment is implemented as a directory for the Power5 microprocessor offered by International Business Machines Corporation of Armonk, N.Y.

In the embodiment of FIG. 1, the addressing macro for a memory array 100 configured with multiple memory subarrays 150 is shown. Each subarray 150 has an associated subarray (SA) row decoder 120 and an associated local bitline (LBL) read controller 130, which generates local read control signals 131. SA row decoders 120 and LBL read controllers 130 are driven by signals received from an address decoder 110. Address decoder 110 receives as input addresses 105 and an array clock 106. Output from address decoder 110 are decoded address fields comprising least significant bits (LSB) 112, most significant bits (MSB) 114 and group bits (GRP) 116. These signals 112, 114 & 116 are forwarded to the SA row decoders 120 and are employed to select a particular row of a particular subarray (0)–(k). In one implementation, the group bits 116 designate blocks of wordlines comprising at least two subarrays. The SA (0)–SA (k) signals 118 drive the local bitline read controllers 130, which output the local read controls to the local to global bitline interface circuitry 140. Signals 112, 114, 116 & 118 are decoded from different portions or fields of the memory array addresses 105 received at the address decoder 110. Local to global interface circuitry 140 drives the appropriate signal onto the global bitlines 161, which are shown connected to a global bitline interface 160.

In this embodiment, a logical OR circuit 170 is employed, receiving as input the group bit signals 116. This combined output of the group bit signals is passed through a delay circuit 180, which under appropriate timing control, outputs the global read control(s) 181 to the global bitline interface 160. Although the embodiment provides enhanced tracking of the global read controls with the local read control signals, implementation of this embodiment requires that the group bit select signals 116 be available in a sufficient space to allow for the logical OR gate 170. This requirement that the group bits be available close together in a sufficient space to logically combine the signals may be acceptable for smaller memory arrays, but may be difficult to achieve with larger arrays, such as SRAM macros where there are relatively large distances between select signals.

Figure 2:
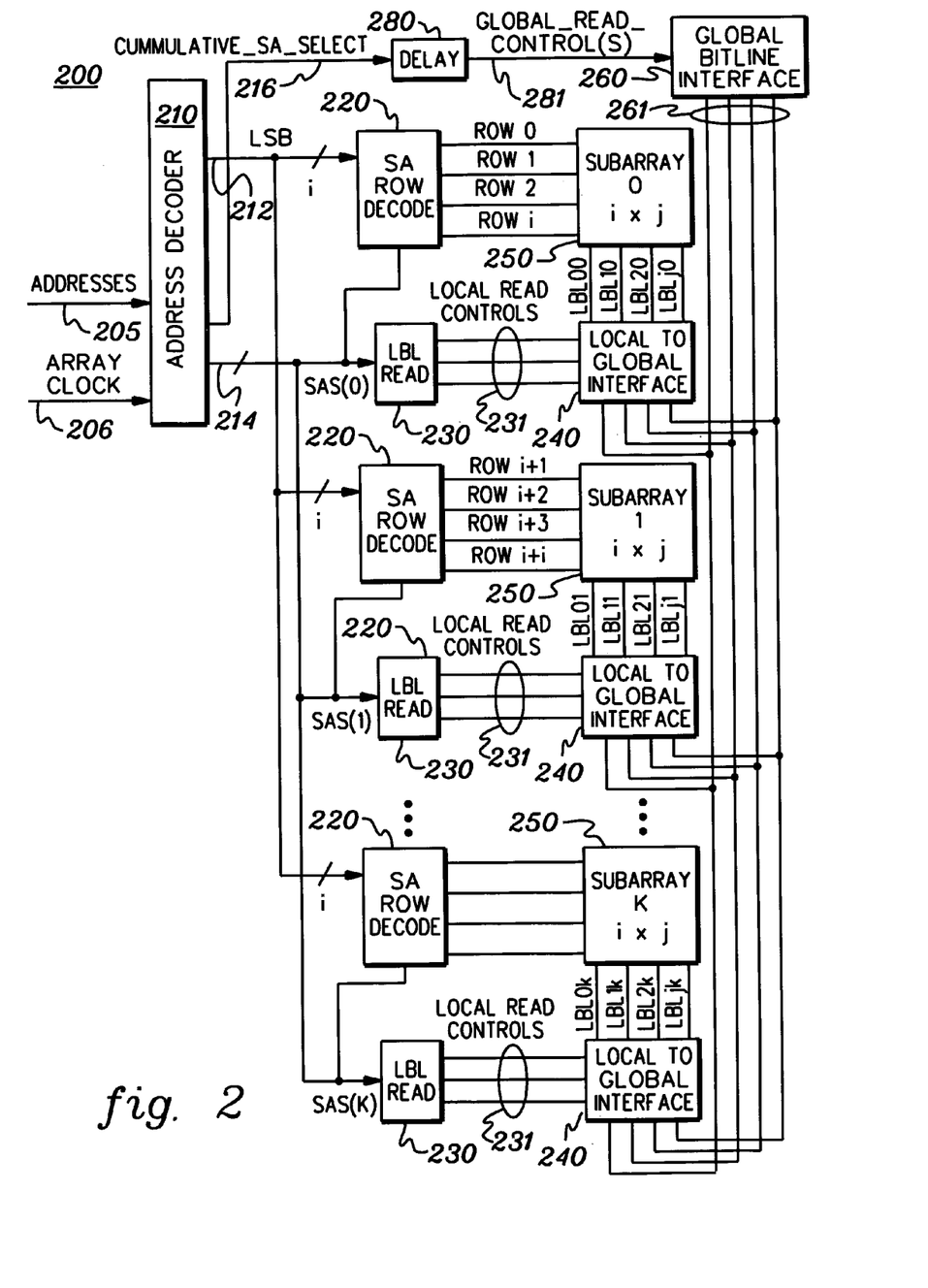
FIG. 2 is a block diagram of another embodiment of a memory array configured with multiple memory subarrays and employing an address decoder outputting subarray select signals and a cumulative subarray select signal to synchronize global read control signals with local read control signals of the respective memory subarrays, in accordance with an aspect of the present invention.

FIG. 2 depicts another embodiment of a memory array 200 configured with multiple subarrays 250 in a hierarchical bitline architecture. In this embodiment, in order to access data (e.g., read data) in the memory array, address bits 205 are decoded by an address decoder 210 to activate a given row of cells via least significant bit (LSB) signals 212 and subarray select (SAS) (0)–(k) signals 214. Each subarray 0–k 250 is selected via an associated SAS (0)–(k) signal 214. Thus, each subarray select signal activates only the word lines of the associated subarray. This activation occurs by passing the SAS (0)–(k) signals through respective subarray (SA) row decoders 220 and associated local bitline (LBL) read control circuitry 230. The SA row decoder 220 selected by a subarray select signal 214 then selects via LSB signals 212 a single wordline within the subarray from which to access data. As explained further below in connection with FIG. 3, the subarray select signals 214 are decoded (in one example) from the most significant bits of the address field, while the individual wordlines within a particular subarray are decoded from the least significant bits 212. When a bit of data is accessed, a selected local bitline, for example, LBL00 of subarray 0 is discharged by the accessed cell. The data from this bitline is then passed to a corresponding global bitline 261 which combines signals from all the subarrays for a given architecture. As one example, 256 rows of data can be organized as 16 subarrays of 16 wordlines each. In this case, each local bitline combines 16 bits of data. The 16 subarrays are then combined on the global bitline.

For a proper read operation, various global read control signals 281 (e.g., global bitline pre-charge, global timing window control (e.g., port enable), latch pre-charge) should be synchronized with and track variation in the local read control signals 231 for the subarrays over a range of power supply, temperature and process variations. In this case, local read control signals 231 are generated by the respective local bitline read controllers 230 driven by the SAS (0)–(k) signals 214 received from the address decoder 210. These local read control signals are input to the local to global interface circuitry 240 of the respective subarray 250. In accordance with the present invention, a global timing reference, referred to herein as the cumulative subarray select signal 216 (i.e., cumulative_SA_select) is employed. As explained further below, this global timing reference is derived in a similar manner as the subarray select signals 214 in order to generate a global read control signal 281 synchronous with the generated local control signals 231. The cumulative subarray select signal 216 output from the address decoder 210, drives a delay circuit 280 which outputs the global read control(s) 281. Those skilled in the art will note that the FIG. 2 drive implementation for generating the global read controls is earlier in the decode process than the approach of FIG. 1, which has its timing reference generated at the same time as the final row select.

Figure 3:
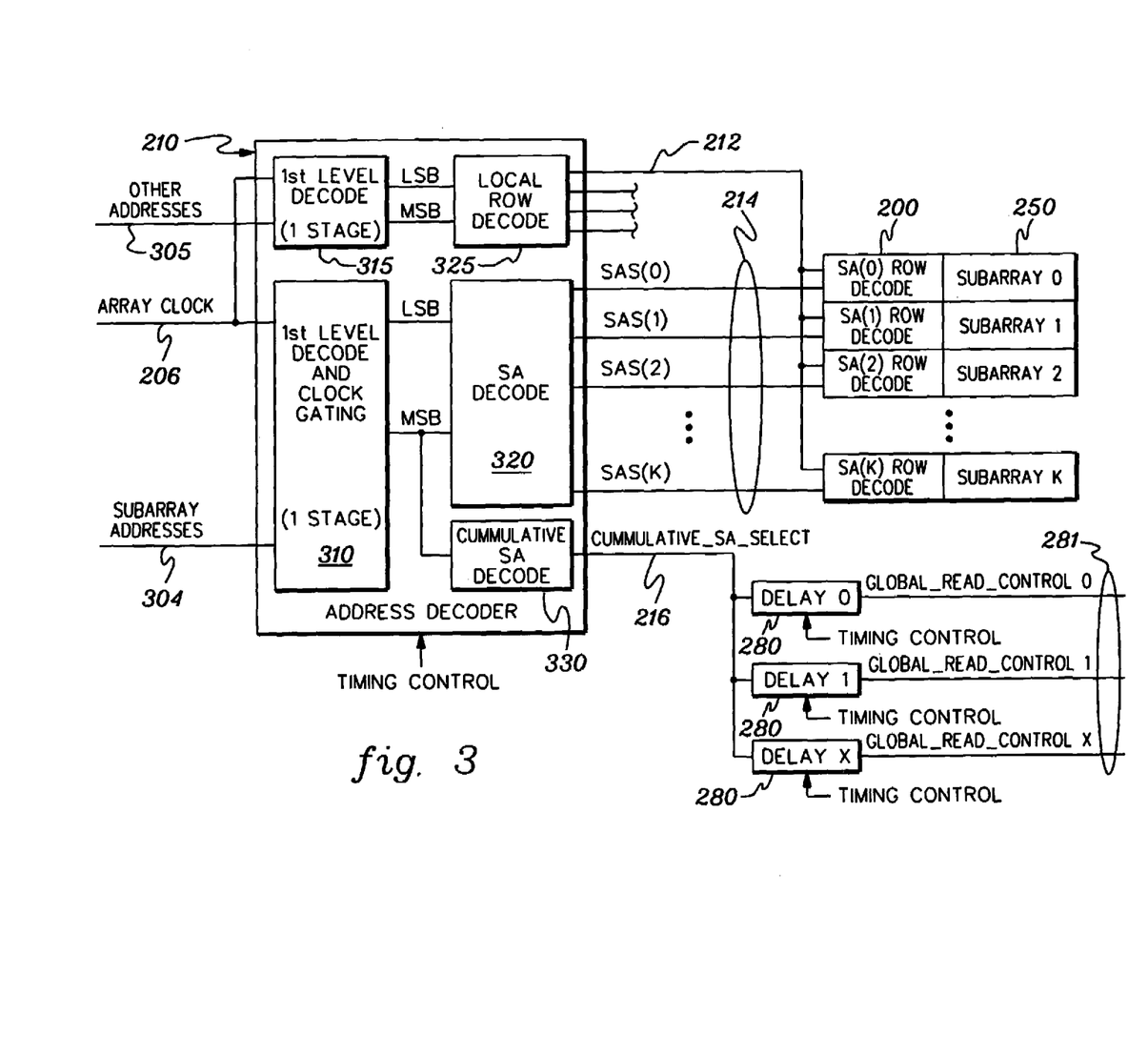
FIG. 3 is a diagram of the memory array of FIG. 2, showing one embodiment of the address decoder thereof in greater detail, in accordance with an aspect of the present invention.

FIG. 3 depicts the memory array of FIG. 2, with one embodiment of address decoder 210 shown. In this implementation, the address signals are broken into subarray address portion 304 and other (or row) addresses 305. Further, there are two first level decode and clock gating stages 310, 315 for facilitating generation of the subarray select signals 214 and the LSB signals 212. An array clock 206 drives both first stages 310, 315. Output from the first level decode and clock gating stage 310 is an internal least significant bit signal and an internal most significant bit signal. The internal most significant bit signals are passed to a subarray (SA) decoder 320, which outputs the SAS (0)–(k) signals 214. Signals 214 are passed to the respective subarray row decoders 220 for selecting a particular subarray 0–k 250. In accordance with an aspect of the present invention, the internal most significant bits (MSB) into the subarray decoder 320 are also passed to a cumulative SA decoder 330, which generates therefrom the cumulative_SA_select signal 216.

Other address signals 305 and the array clock 206 are input to the first level decode stage 315 for generation of additional internal least significant bit (LSB) and most significant bit (MSB) signals. These additional signals drive a local row decoder 325 for output of the memory array LSB signals 212. Signals 212 are also input to the SA row decoders 220 for selection of a particular row or wordline to be accessed.

The cumulative_subarray_select signal 216 can drive multiple delay 0–X circuits 280, each of which outputs a global_read_control 0–X signal 281. Those skilled in the art will note that, in accordance with the present invention, the cumulative_subarray_select signal 216 is generated directly from a decoding of address signals within the address decoder 210, and is created at the same time as the second level decode (SA decode 320) within the address decoder. This is earlier than the timing reference generated in FIG. 1, where the timing reference is generated at the same time as the final row select.

Figure 4A:
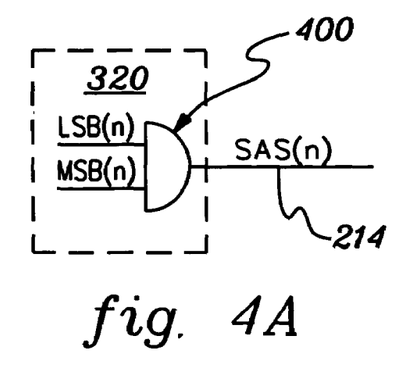
FIG. 4A is a logic AND gate depiction of a portion of a subarray decoder for the address decoder of FIGS. 2 & 3, in accordance with an aspect of the present invention.

As shown in FIGS. 4A–5B, similar circuitry is employed to generate the SAS signals 214 and the cumulative_subarray_select signal 216. Referring first to FIG. 4A, one of a plurality of AND logic circuits 400 is shown within subarray decoder 320. AND circuit 400 receives as input from the first level decode of the address decoder (FIG. 3) a least significant bit (LSB)(n) and a most significant bit (MSB)(n), and outputs a SAS (n) signal when both inputs are active. One circuit implementation of this logic is depicted in FIG. 4B.

Figure 4B:
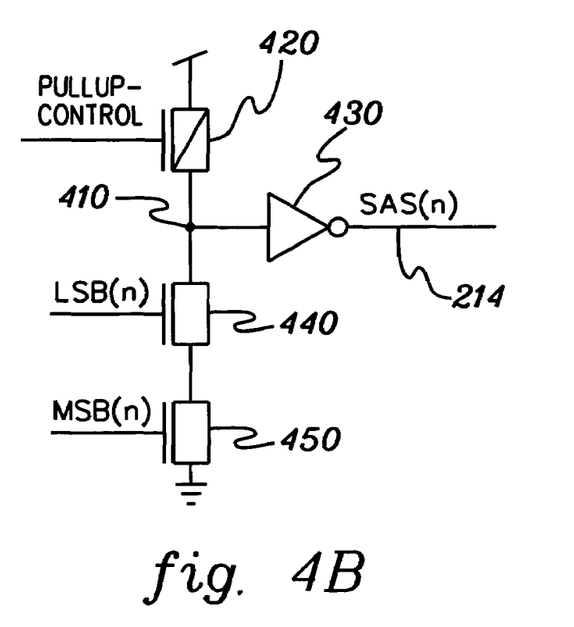
FIG. 4B is one circuit implementation of the AND gate of FIG. 4A, in accordance with an aspect of the present invention.
Figure 5A:
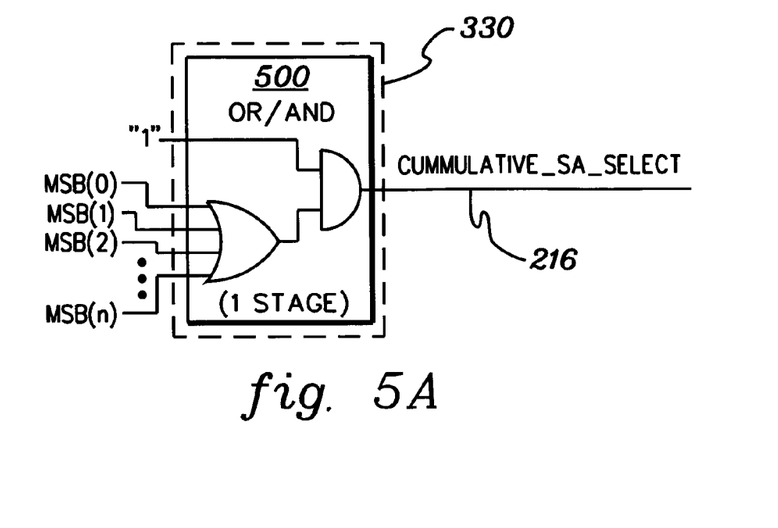
FIG. 5A is a logic OR/AND gate depiction of a cumulative subarray decoder for the address decoder of FIGS. 2 & 3, in accordance with an aspect of the present invention.
Figure 5B:
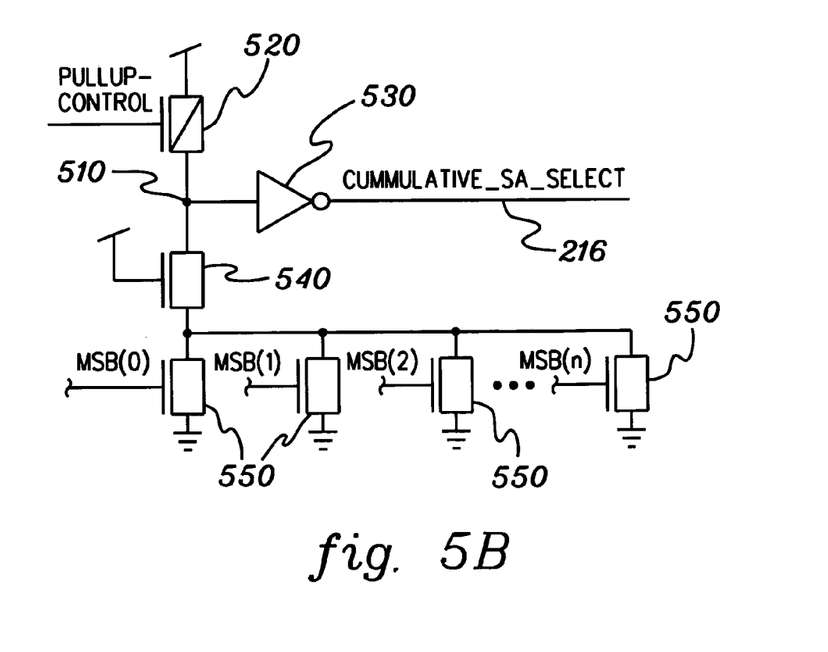
FIG. 5B is one circuit implementation of the OR/AND gate of FIG. 5A employing a similar multi-device stack to the AND gate implementation of FIG. 4B, in accordance with an aspect of the present invention.

In FIGS. 4B & 5B, complementary metal oxide semiconductor (CMOS) circuits are employed with P-channel field-effect transistors (PFETs) indicated in the figures by a rectangle with a diagonal line formed therein and a control element or gate electrode arranged adjacent thereto and with N-channel field-effect transistors (NFETs) indicated by a rectangle without a diagonal line and with a control element or gate electrode arranged adjacent thereto.

Referring to FIG. 4B, an intermediate node 410 is biased high by PFET 420. The value of intermediate node 410 is inverted 430 and output as the SAS (n) 214. Intermediate node 410 is pulled low when NFETs 440 & 450 are both gated active by the internal LSB (n) and internal MSB (n) signals to SA decoder 320. When intermediate node 410 is low, the SAS (n) output from inverter 430 is high.

One logic depiction for the cumulative subarray decode 330 circuitry of FIG. 3 is depicted in FIG. 5A. In this implementation, circuitry 330 is shown to include an OR/AND circuit 500. In this circuit, the internal most significant bits (MSB) (0)–(k) obtained from the subarray addresses are input to an OR gate, the output of which is input to the AND gate, which also receives a high signal "1". The cumulative_SA_select signal is the output of this AND gate.

FIG. 5B depicts one circuit implementation of the logic of FIG. 5A. This implementation parallels that of the subarray decode implementation of FIG. 4B. An intermediate node 510 is again biased high by a PFET 520. The signal at intermediate node 510 is inverted 530 and output as the cumulative_subarray_select signal 216. The cumulative_subarray_select signal is low (i.e., inactive) unless two series connected NFETs 540, 550 are both active. The first NFET 540 has its gate tied to VDD, and thus, is always active. The remaining NFETs are coupled in parallel, with the gate of each NFET being driven by a different most significant bit (0)–(n) signal within the address decoder. Thus, whenever one of the most significant bit signals into the subarray decoder and cumulative subarray decoder is active, the cumulative_SA_select signal is active.

Figure 6:
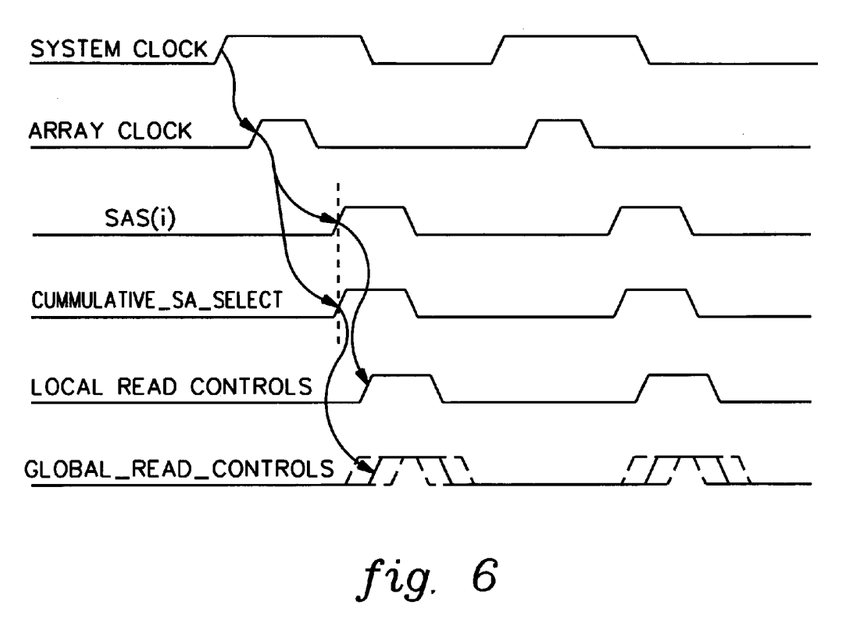
FIG. 6 is a timing diagram showing synchronous generation of local read control signals and global read control signals from subarray select signals and the cumulative subarray select signal, respectively, in accordance with an aspect of the present invention.

Those skilled in the art will note that by designing the circuitry for the decode (an OR-AND circuit) of the cumulative_subarray_select to mimic the decode (an AND circuit) of the subarray select signals, tracking between these signals is achieved because the transistor level devices have similar biasing and switching responses. Since the local read controls (231) are generated using a subarray select signal and the global read controls (281) are generated using a the cumulative_subarray_select signal, better tracking between the local and global read controls is also achieved. To further maintain timing relationships, the drive strength, loading, and global wiring of the subarray select and cumulative subarray select can also be configured similar. A final programmable delay 280 (FIGS. 2 & 3) is used to generate each global read control signal. This programmability allows for fine tuning of the delay and pulse width associated with each global read control as shown in the timing diagram of FIG. 6. This also provides a mechanism for exploring margins in hardware testing. As shown in FIG. 6, a system clock drives the array clock, which then drives the subarray select signals and cumulative subarray select signals. The subarray select signals drive the local read controls, while the cumulative subarray select signals drives the global read controls.

Those skilled in the art will note from the above discussion that the present invention is particularly advantageous for large high speed memory arrays, such as SRAM macros, whose subarray select signals are physically far apart from one other, and yet there is a need to quickly generate synchronous global read control signals.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A global and local read control synchronization method for a memory array configured with multiple memory subarrays, the method comprising:
    decoding address signals to activate based thereon subarray select signals and a cumulative subarray select signal, the cumulative subarray select signal going active whenever a subarray select signal goes active; and
    wherein local read control signals for the multiple memory subarrays are obtained employing the subarray select signals, and at least one global read control signal for the memory array is obtained employing the cumulative subarray select signal.

2. The method of claim 1, wherein the decoding comprises employing an address decoder, the address decoder comprising a subarray decoder and a cumulative subarray decoder, the subarray decoder providing the subarray select signals, and the cumulative subarray decoder providing the cumulative subarray select signal, and wherein the subarray decoder and the cumulative subarray decoder each employ a common portion of the address signals.

3. The method of claim 2, wherein the address signals comprise subarray addresses, and wherein the common portion of the address signals employed by the subarray decoder and the cumulative subarray decoder comprises a most significant bits portion of the subarray addresses.

4. The method of claim 2, wherein the subarray decoder and the cumulative subarray decoder each comprises a multi-device stack, each multi-device stack driving an output active when at least two series connected transistors of the stack are both gated active.

5. The method of claim 1, wherein each subarray select signal drives a different, associated memory subarray of the multiple memory subarrays, each subarray select signal driving both a subarray row decoder and a local bitline read controller for the associated memory subarray, and wherein the local bitline read controller outputs local read control signals for the associated memory subarray.

6. The method of claim 1, wherein the cumulative subarray select signal drives at least one delay circuit, an output of the at least one delay circuit being the at least one global read control signal, wherein the at least one delay circuit further comprises at least one timing control input, the at least one timing control input allowing for fine tuning of at least one of a rising pulse edge or a falling pulse edge of the at least one global read control signal.

7. The method of claim 1, wherein the decoding comprises employing a subarray address decoder to decode the address signals and activate based thereon the subarray select signals, and employing a cumulative subarray decoder to decode the address signals and active based thereon the cumulative subarray select signal, wherein the subarray decoder and the cumulative subarray decoder are each logic implemented as a single timing stage, and wherein each pulse of the cumulative subarray select signal is synchronous with a pulse of the subarray select signals.

8. A method comprising:
providing a memory array configured with multiple memory subarrays, each memory subarray being accessed via a respective subarray select signal; and
synchronizing at least one global read control signal for the memory array with local read control signals for the memory subarrays, the synchronizing comprising decoding subarray address signals to activate based thereon subarray select signals and a cumulative subarray select signal, the cumulative subarray select signal going active whenever a subarray select signal goes active, and wherein the local read control signals for the multiple memory subarrays are obtained employing the subarray select signals, and the at least one global read control signal for the memory array is obtained employing the cumulative subarray select signal.

9. The method of claim 8, wherein the decoding comprises employing an address decoder, the address decoder comprising a subarray decoder and a cumulative subarray decoder, the subarray decoder providing the subarray select signals and the cumulative subarray decoder providing the cumulative subarray select signal, and wherein the subarray decoder and the cumulative subarray decoder each employ a common portion of the subarray address signals.

10. The method of claim 9, wherein the subarray decoder and the cumulative subarray decoder each comprises a multi-device stack, each multi-device stack driving an output active when at least two series connected transistors of the stack are both gated active.

11. The method of claim 8, wherein each subarray select signal drives a different, associated memory subarray of the multiple memory subarrays, each subarray select signal driving both a subarray row decoder and a local bitline read controller for the associated memory subarray, and wherein the local bitline read controller outputs local read control signals for the associated memory subarray.

12. The method of claim 8, wherein the cumulative subarray select signal drives at least one delay circuit, an output of the at least one delay circuit being the at least one global read control signal, wherein the at least one delay circuit further comprises at least one timing control input, the at least one timing control input allowing for fine tuning of at least one of a rising pulse edge or a falling pulse edge of the at least one global read control signal.

13. The method of claim 8, wherein the decoding comprises employing a subarray address decoder to decode the subarray address signals and activate based thereon the subarray select signals, and employing a cumulative subarray decoder to decode the subarray address signals and activate based thereon the cumulative subarray select signal, wherein the subarray decoder and the cumulative subarray decoder are each logic implemented as a single timing stage, and wherein each pulse of the cumulative subarray select signal is synchronous with a pulse of the subarray select signals.

14. A global and local read control synchronization system for a memory array configured with multiple memory subarrays, the system comprising:
an address decoder to decode address signals and activate based thereon subarray select signals and a cumulative subarray select signal, the cumulative subarray select signal going active whenever a subarray select signal goes active; and
wherein local read control signals for the multiple memory subarrays are obtained employing the subarray select signals, and at least one global read control signal for the memory array is obtained employing the cumulative subarray select signal.

15. The system of claim 14, wherein the address decoder comprises a subarray decoder and a cumulative subarray decoder, the subarray decoder providing the subarray select signals, and the cumulative subarray decoder providing the cumulative subarray select signal, and wherein the subarray decoder and the cumulative subarray decoder each employ a common portion of the address signals.

16. The system of claim 15, wherein the address signals comprise subarray addresses, and wherein the common portion of the address signals employed by the subarray decoder and the cumulative subarray decoder comprises a most significant bits portion of the subarray addresses.

17. The system of claim 15, wherein the subarray decoder and the cumulative subarray decoder each comprises a multi-device stack, each multi-device stack driving an output active when at least two series connected transistors of the stack are both gated active.

18. The system of claim 14, wherein each subarray select signal drives a different, associated memory subarray of the multiple memory subarrays, each subarray select signal driving both a subarray row decoder and a local bitline read controller for the associated memory subarray, and wherein the local bitline read controller outputs local read control signals for the associated memory subarray.

19. The system of claim 14, wherein the cumulative subarray select signal drives at least one delay circuit, an output of the at least one delay circuit being the at least one global read control signal, wherein the at least one delay circuit further comprises at least one timing control input, the at least one timing control input allowing for fine tuning of of at least one of a rising pulse edge or a falling pulse edge of the at least one global read control signal.

20. The system of claim 14, wherein the address decoder further comprises a subarray address decoder to decode the address signals and activate based thereon the subarray select signals, and a cumulative subarray decoder to decode the address signals and activate based thereon the cumulative subarray select signal, wherein the subarray decoder and the cumulative subarray decoder are each implemented as a single timing stage, and wherein each pulse of the cumulative subarray select signal is synchronous with a pulse of the subarray select signals.

21. A system comprising:
 a memory array configured with multiple memory subarrays, each memory subarray being accessed via a respective subarray select signal; and
 means for synchronizing at least one global read control signal for the memory array with local read control signals for the memory subarrays, the means for synchronizing comprising means for decoding subarray address signals to activate based thereon subarray select signals and a cumulative subarray select signal, the cumulative subarray select signal going active whenever a subarray select signal goes active, and wherein the local read control signals for the multiple memory subarrays are obtained employing the subarray select signals, and the at least one global read control signal for the memory array is obtained employing the cumulative subarray select signal.

22. The system of claim 21, wherein the means for decoding comprises an address decoder, the address decoder comprising a subarray decoder and a cumulative subarray decoder, the subarray decoder providing the subarray select signals and the cumulative subarray decoder providing the cumulative subarray select signal, and wherein the subarray decoder and the cumulative subarray decoder each employ a common portion of the subarray address signals.

23. The system of claim 22, wherein the subarray decoder and the cumulative subarray decoder each comprises a multi-device stack, each multi-device stack driving an output active when at least two series connected transistors of the stack are both gated active.

24. The system of claim 21, wherein each subarray select signal drives a different, associated memory subarray of the multiple memory subarrays, each subarray select signal driving both a subarray row decoder and a local bitline read controller for the associated memory subarray, and wherein the local bitline read controller outputs local read control signals for the associated memory subarray.

25. The system of claim 21, wherein the cumulative subarray select signal drives at least one delay circuit, an output of the at least one delay circuit being the at least one global read control signal, wherein the at least one delay circuit further comprises at least one timing control input, the at least one timing control input allowing for fine tuning of at least one of a rising pulse edge or a falling pulse edge of the at least one global read control signal.

26. The system of claim 21, wherein the means for decoding comprises a subarray address decoder to decode the subarray address signals and activate based thereon the subarray select signals, and a cumulative subarray decoder to decode the subarray address signals and activate based thereon the cumulative subarray select signal, wherein the subarray decoder and the cumulative subarray decoder are each logic implemented as a single timing stage, and wherein each pulse of the cumulative subarray select signal is synchronous with a pulse of the subarray select signals.

* * * * *